(12) United States Patent
Patti et al.

(10) Patent No.: US 8,759,188 B2
(45) Date of Patent: Jun. 24, 2014

(54) RADIATION HARDENED BIPOLAR INJUNCTION TRANSISTOR

(75) Inventors: Alfonso Patti, Tremestieri Etneo (IT);
Antonino Schillaci, Messina (IT);
Bartolome Marrone, Catania (IT);
Gianleonardo Grasso, Giarre (IT);
Rajesh Kumar, Singapore (SG)

(73) Assignees: STMicroelectronics S.r.l., Agrate Brianza (MB) (IT); STMicroelectronics Asia Pacific Pte. Ltd., Singapore (SG)

( * ) Notice: Subject to any disclaimer, the term of this patent is extended or adjusted under 35 U.S.C. 154(b) by 219 days.

(21) Appl. No.: 13/334,087

(22) Filed: Dec. 22, 2011

(65) Prior Publication Data
US 2012/0168909 A1    Jul. 5, 2012

(30) Foreign Application Priority Data

Dec. 29, 2010 (IT) .............................. MI2010A2448

(51) Int. Cl.
| | | |
|---|---|---|
| H01L 21/331 | (2006.01) | |
| H01L 29/732 | (2006.01) | |
| H01L 29/66 | (2006.01) | |
| H01L 29/40 | (2006.01) | |

(52) U.S. Cl.
CPC .......... H01L 29/402 (2013.01); H01L 29/7322 (2013.01); H01L 29/66272 (2013.01)
USPC .......................................... 438/373; 257/565

(58) Field of Classification Search
CPC .............. H01L 29/66234; H01L 29/70; H01L 29/6625
USPC .................. 257/565; 438/375, 339, 364, 369, 438/371–373
See application file for complete search history.

(56) References Cited

U.S. PATENT DOCUMENTS

| | | | |
|---|---|---|---|
| 4,717,678 A * | 1/1988 | Goth | 438/372 |
| 4,881,111 A | 11/1989 | Sanders | |
| 5,648,281 A | 7/1997 | Williams et al. | |
| 6,372,595 B1 * | 4/2002 | Thiel et al. | 438/335 |
| 6,445,058 B1 | 9/2002 | Thiel et al. | |
| 2003/0143774 A1 | 7/2003 | Takahashi et al. | |
| 2004/0183079 A1 * | 9/2004 | Kaneko et al. | 257/77 |
| 2005/0287754 A1 | 12/2005 | van Vonno et al. | |
| 2006/0157736 A1 | 7/2006 | van Vonno et al. | |
| 2007/0158677 A1 | 7/2007 | Ko | |

OTHER PUBLICATIONS

Italian Search Report and Written Opinion dated Aug. 8, 2011from corresponding Italian Application No. MI20102448.

(Continued)

*Primary Examiner* — Yu-Hsi D Sun
(74) *Attorney, Agent, or Firm* — Wolf, Greenfield & Sacks, P.C.

(57) ABSTRACT

A method for integrating a bipolar injunction transistor in a semiconductor chip includes the steps of forming an intrinsic base region of a second type of conductivity extending in the collector region from a main surface through an intrinsic base window of the sacrificial insulating layer, forming an emitter region of the first type of conductivity extending in the intrinsic base region from the main surface through an emitter window of the sacrificial insulating layer, removing the sacrificial insulating layer, forming an intermediate insulating layer on the main surface, and forming an extrinsic base region of the second type of conductivity extending in the intrinsic base region from the main surface through an extrinsic base window of the intermediate insulating layer.

24 Claims, 6 Drawing Sheets

(56) References Cited

OTHER PUBLICATIONS

Burnett, J.D. et al., Modeling Hot-Carrier Effects in Polysilicon Emitter Bipolar Transistors, IEEE Transactions on Electron Devices, IEEE Service Center, Piscataway, NJ, US, vol. 35, No. 12, Dec. 1, 2988, pp. 2238-2244, XP000048193.

European Search Report dated Apr. 2, 2012 from corresponding European Application No. 11196036.

* cited by examiner

RADIATION HARDENED BIPOLAR INJUNCTION TRANSISTOR

CROSS REFERENCE TO RELATED APPLICATIONS

This application claims the priority benefit of Italian patent application number MI2010A002448 filed on Dec. 29, 2010, entitled RADIATION HARDENED BIPOLAR INJUNCTION TRANSISTOR, which is hereby incorporated by reference to the maximum extent allowable by law.

BACKGROUND

1. Technical Field

The solution according to one or more embodiments relates to the microelectronics field. More specifically, a solution relates to bipolar injection transistors.

2. Discussion of the Related Art

Bipolar injunction transistors (BJT), or simply bipolar transistors, are commonly used in most integrated circuits. A problem of the bipolar transistors is that they are quite sensitive to the presence of mobile charges in an insulating layer (for example, a silicon dioxide layer) that covers a front surface of a semiconductor chip wherein the bipolar transistors are integrated. Indeed, these mobile charges may cause undesired and uncontrolled variations in several electrical parameters of the bipolar transistors, such as their Direct Current (DC) forward current gain ($h_{FE}$).

With reference in particular to Small Signal (SS) bipolar transistors (typically used as switches or amplifiers), the mobile charges may be due to pollution (for example, of Potassium, Sodium, Copper, or other alkaline elements) during a corresponding production process. This problem is generally addressed by providing a clean process environment that limits the above-mentioned pollution.

In any case, mobile charges may be created when the bipolar transistors are exposed to ionizing radiations. Indeed, when particles or electromagnetic waves with sufficiently high energy (such as γ-rays) strike the chip, they cause the detachment of electrons from their atoms in the insulating layer, so as to create corresponding free electron-hole pairs. Due to the high mobility of the free electrons in the insulating layer, they drift very fast and recombine at the terminals of the bipolar transistors. Conversely, the free holes have low mobility, so that they remain trapped in the insulating layer where they gradually accumulate. The corresponding positive charge in the insulating layer creates an inverting layer (with a negative charge) in P-type regions at the front surface of the chip (for example, in base regions of bipolar transistors of NPN type with vertical structure). As a result, a depletion layer between each base region and a corresponding emitter region at the front surface of the chip enlarges, thereby lowering the DC forward current gain of the bipolar transistors.

The above-mentioned problem is particularly acute in special operative conditions, such as in avionic and aero-spatial applications—wherein the bipolar transistors are typically exposed to ionizing radiations due to cosmic radiations and solar winds.

In order to cope with this problem, radiation hardening techniques have been devised to make the bipolar transistors more resistant to the ionizing radiations—with the resulting bipolar transistors that are commonly referred to as radiation-hardened (or simply rad-hard) bipolar transistors.

For example, US-A-2005/0287754 (the entire disclosure of which is herein incorporated by reference) proposes a production process wherein a window is opened through a portion of the silicon dioxide, so as to expose the whole emitter region and adjoining areas of the base region on the front surface of the chip. A thin oxide layer (for example, a gate oxide) is thermally grown in this window. A field plate is formed over the emitter region and the adjoining areas of the base region; a window is then opened through the field plate and the thin oxide layer to expose a portion of the emitter region. An emitter terminal is formed in correspondence with this window, so as to contact both the emitter region and the field plate. The thin oxide layer reduces the volume that is available for trapping the free holes, thereby reducing their accumulation. At the same time, the field plate being connected to the emitter terminal (so as to be always biased in operation to a base-emitter voltage Vbe) limits the electric field at the front surface, and it enhances the surface concentration of free holes in the base region. The same document also discloses an alternative implementation, wherein a metal layer is patterned to form a combined emitter terminal (contacting the emitter region through the window opened in the thin oxide layer) and field plate (extending on the thin oxide layer).

Alternatively, U.S. Pat. No. 5,881,111 (the entire disclosure of which is herein incorporated by reference) proposes a bipolar transistor with an emitter region of N− type, a base region of P-type inside the emitter region, and a collector region of N+ type inside the base region. An emitter contact ring of P+ type is added at the front surface, extending in part into the emitter region and in part into the base region; the contact ring has a very high impurity concentration, at least three order of magnitude greater than the one of the emitter region. This emitter ring reduces the superficial inversion of the base region due to the trapped free holes.

However, the techniques known in the art are not completely satisfactory (especially for applications having very strict radiation hardening requirements).

SUMMARY

In its general terms, one or more embodiments are based on the idea of providing a planar thin insulating layer.

Particularly, one or more aspects of embodiments are set out in the independent claims, with advantageous features of the same solution that are set out in the dependent claims, whose wording is herein incorporated verbatim by reference (with any advantageous feature provided with reference to a specific aspect of the solution according to an embodiment that applies mutatis mutandis to every other aspect thereof).

More specifically, an aspect of the solution according to an embodiment provides a method for integrating a bipolar injunction transistor in a semiconductor chip. The chip has a main surface that is covered by a sacrificial insulating layer (for example, a silicon dioxide layer); the chip includes a collector region of a first type of conductivity (for example, N) extending from the main surface. The method includes the following steps. An intrinsic base region of a second type of conductivity (for example, P−) is formed extending in the collector region from the main surface through an intrinsic base window of the sacrificial insulating layer. An emitter region of the first type of conductivity (for example, N+) is formed extending in the intrinsic base region from the main surface through an emitter window of the sacrificial insulating layer. In a solution according to an embodiment, the sacrificial insulating layer is removed. An intermediate insulating layer (for example, a radiation hardened thin silicon dioxide layer) is then formed on the main surface; the intermediate insulating layer has a thickness that is lower than a thickness of the sacrificial layer (for example, lower than between 1/10 and 1/100 thereof). An extrinsic base region of the second type of conductivity (for example, P+) is formed extending in the intrinsic base region from the main surface through an extrinsic base window of the intermediate insulating layer. The extrinsic base region has a concentration of impurities that is higher than a concentration of impurities of the intrinsic base region; the extrinsic base region is also separated from the emitter region by a portion of the intrinsic base region.

Another aspect of a solution according to an embodiment provides a corresponding bipolar injection transistor.

BRIEF DESCRIPTION OF THE DRAWINGS

One or more embodiments, as well as further features and the advantages thereof, will be best understood with reference to the following detailed description, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessarily drawn to scale (with some details that may be exaggerated and/or simplified) and that, unless otherwise indicated, they are merely used to conceptually illustrate the structures and procedures described herein. Particularly.

DETAILED DESCRIPTION

With reference in particular to FIG. 1A-FIG. 1L, there are shown the main stages of a production process of a bipolar transistor according to an embodiment (denoted with the reference 100 at the end of this production process). In general, the production process is performed at the level of a wafer of semiconductor material (for example, silicon), wherein the same structure is integrated simultaneously in a large number of identical areas thereof; at the end of the production process, these areas of the wafer are separated into corresponding chips of semiconductor material through a cutting operation (for simplicity of description, however, in the following reference will be made only to one of such chips, shown in cross-section view in the different figures). As usual, the concentrations of N-type and P-type impurities (or dopant) of the semiconductor material are denoted by adding the sign + or the sign − to the letters N and P to indicate a high or low concentration of impurities, respectively; the letters N and P without the addition of any sign + or − denote concentrations of intermediate value.

Figure 1A:
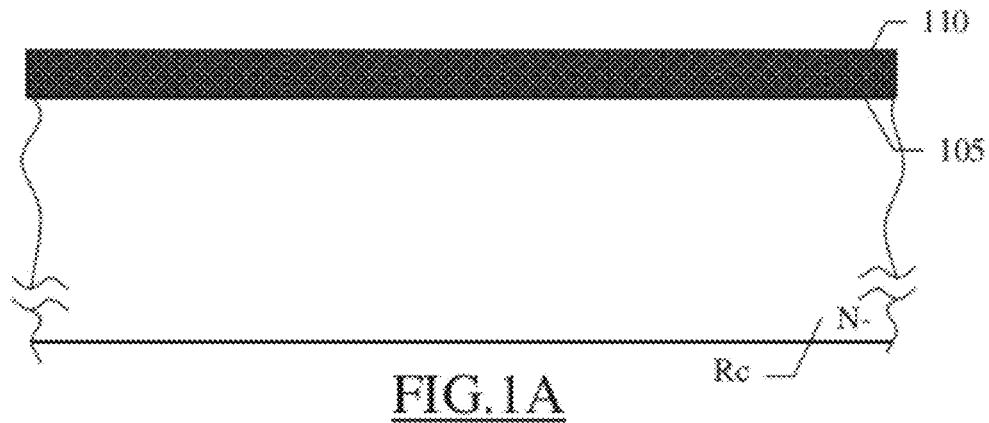
FIG. 1A-FIG. 1L show the main stages of a production process of a bipolar transistor according to an embodiment.

Starting from FIG. 1A, the chip includes a collector region Rc of N− type (for example, with a concentration of impurities of the order of $10^{13}$-$10^{16}$ atoms/cm$^3$). The collector region Rc extends in the chip from a main, or front, surface thereof 105 (for example, being formed in a corresponding electrically insulated well of the chip, not shown in the figure). The front surface 105 is covered by a sacrificial insulating layer 110 (for example, a silicon dioxide layer being obtained by a thermal oxidation operation); typically, the sacrificial insulating layer 110 has a relatively high thickness (for example, of the order of 0.5-2 μm).

Figure 1B:
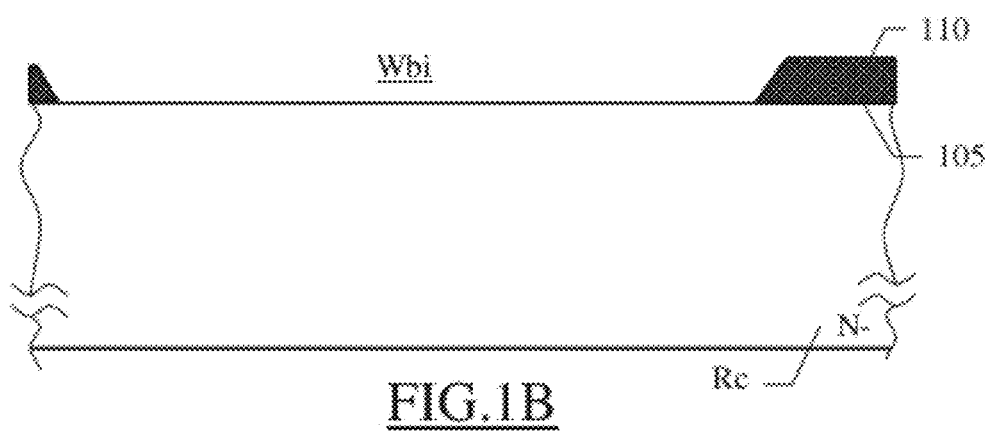

Moving to FIG. 1B, an intrinsic base window Wbi is opened through the sacrificial insulating layer 110. For example, this result is achieved by means of a lithographic operation based on a corresponding intrinsic base mask (not shown in the figure). Briefly, the wafer is covered by a photo-resist layer. The photo-resist layer is developed selectively through the intrinsic base mask (having openings corresponding to the intrinsic base windows of all the chips of the wafer); the developed portion of the photo-resist layer (when of the positive type) is then removed, so as to leave exposed the sacrificial insulating layer 110 only in correspondence of the intrinsic base windows. The wafer is now subject to an etching operation (for example, of the plasma type) to remove the exposed portions of the sacrificial insulating layer 110 being not protected by the photo-resist layer (with a small undercutting thereof due to the non-ideal anisotropy of the etching operation). At this point, the photo-resist layer is stripped away.

Figure 1C:
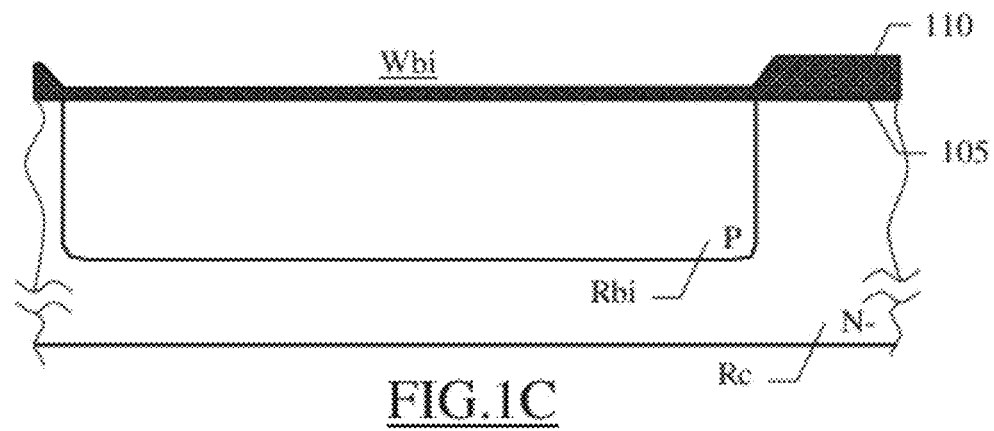

Considering now FIG. 1C, an intrinsic base region Rbi of P type (for example, with a concentration of impurities of the order of $10^{16}$-$10^{19}$ atoms/cm$^3$) is formed through the intrinsic base window Wbi (so as to extend in the collector region Rc from the front surface 105). For example, this result is achieved by a ion implantation operation (wherein corresponding impurity ions are implanted through the intrinsic base window Wbi), followed by an annealing operation (to activate the implanted impurity ions), and a diffusion operation (to migrate the activated impurity ions deeply); during the above-described thermal operations, the sacrificial insulating layer 110 grows again, so as to obtain a stepped profile thereof (with a thin layer of silicon dioxide covering the intrinsic base region Rbi, and a thick layer of silicon dioxide covering the rest of the chip).

Figure 1D:
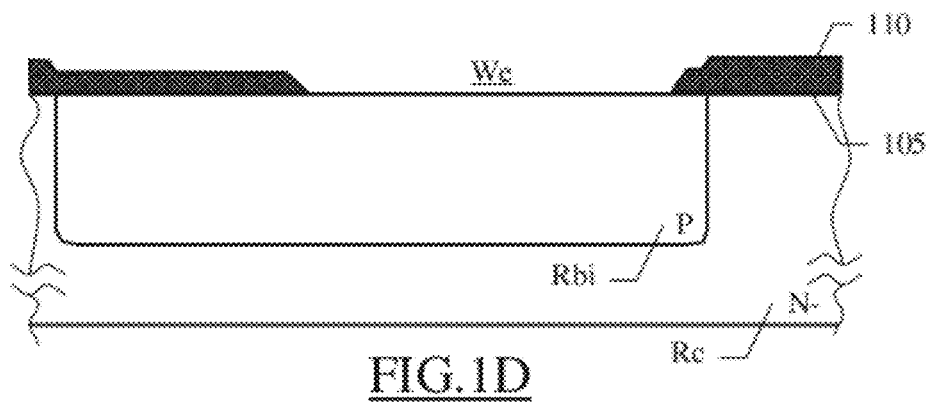

Passing to FIG. 1D, an emitter window We is opened through the sacrificial insulating layer 110. For example, this result is achieved by means of a lithographic operation based on a corresponding emitter mask (not shown in the figure); the emitter mask is aligned with the intrinsic base mask by means of a collimation operation with a corresponding reference mark that was formed during the corresponding photo-lithographic operation (so as to obtain the desired alignment of the emitter window We with the intrinsic base region Rbi).

Figure 1E:
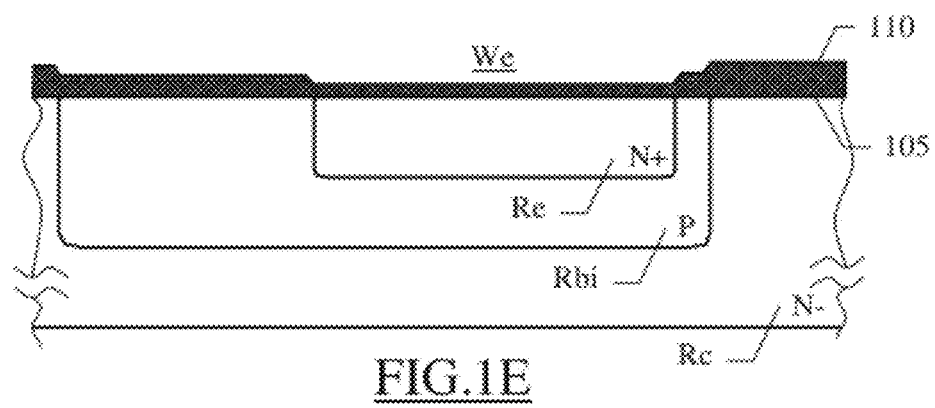

The production process continues to FIG. 1E, wherein an emitter region Re of N+ type (for example, with a concentration of impurities of the order of $10^{19}$-$10^{22}$ atoms/cm$^3$) is formed through the emitter window We (so as to extend in the intrinsic base region Rbi from the front surface 105). For example, this result is achieved by a ion implantation operation, followed by an annealing operation, and a diffusion operation; during the above-described thermal operations, the sacrificial insulating layer 110 grows again, so as to increment its stepped profile (with a thin layer of silicon dioxide covering the emitter region Re, a medium layer of silicon dioxide covering the intrinsic base region Rbi, and a thick layer of silicon dioxide covering the rest of the chip). In the solution according to an embodiment, at this point the sacrificial insulating layer 110 is completely removed.

Figure 1F:
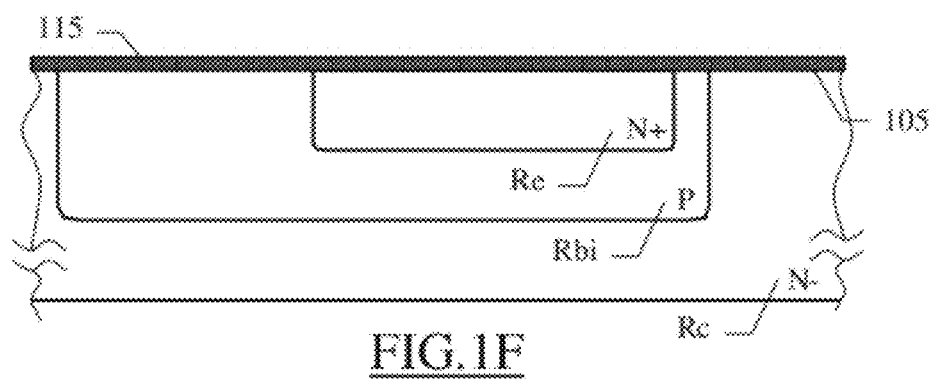

With reference to FIG. 1F, an intermediate insulating layer 115 is now formed on the front surface 105. The intermediate insulating layer 115 has a relatively low thickness, and in any case lower than the one of the sacrificial insulating layer; for example, the thickness of the intermediate insulating layer 115 is equal to between 1/5 and 1/200, and preferably equal to between $1/7$ and $1/150$, such as equal to between $1/10$ and $1/100$ of the thickness of the sacrificial insulating layer (for example, of the order of 50-200 nm). The intermediate insulating layer 115 may be a silicon dioxide layer that is obtained by a thermal oxidation operation (for example, by using process steps already available in a MOS technology to form its gate oxides). Preferably, the intermediate insulating layer 115 is radiation hardened (so as to reduce its hole trapping characteristics) by means of techniques that are known per se—for example, by exploiting a clean process environment.

Figure 1G:
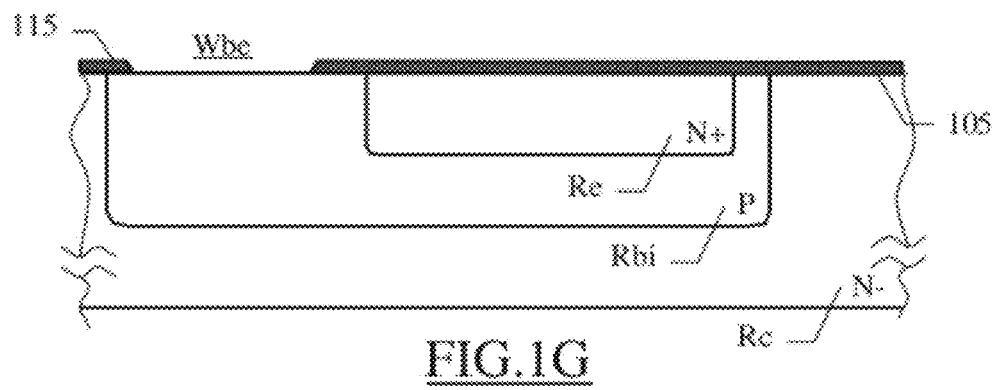

Moving to FIG. 1G, an extrinsic base window Wbe is opened through the intermediate insulating layer 115. For example, this result is achieved by means of a lithographic operation based on a corresponding extrinsic base mask (not shown in the figure); the extrinsic base mask is aligned with the intrinsic base mask by means of a collimation operation with a corresponding reference mark that was formed during the corresponding photo-lithographic operation (so as to obtain the desired alignment of the extrinsic base window Wbe with the intrinsic base region Rbi, and then with the emitter region Re as well).

Figure 1H:
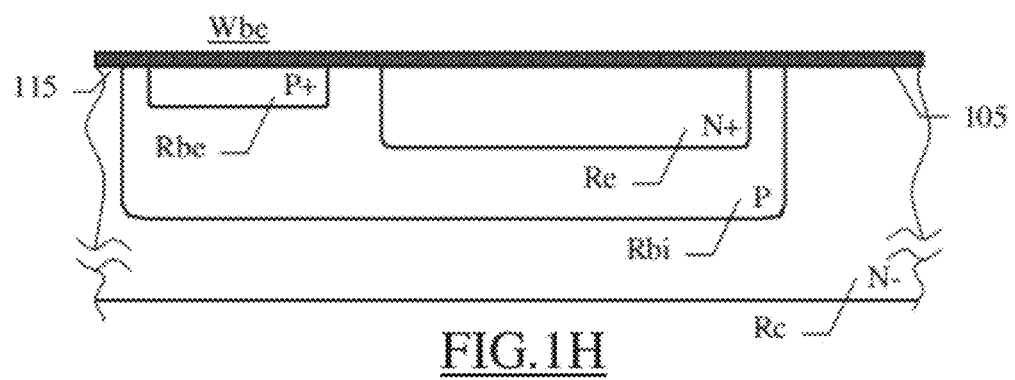

Considering now FIG. 1H, an extrinsic base region Rbe of P+ type is formed through the extrinsic base window Wbe (so as to extend in the intrinsic base region Rbi from the front surface 105). The extrinsic base region Rbe has a relatively high concentration of impurities, and in any case higher than the one of the intrinsic base region Rbi; for example, the concentration of impurities of the extrinsic base region Rbe is equal to $10^5$, and preferably equal to $10^4$, such as equal to $10^3$ times the concentration of impurities of the intrinsic base region Rbi (for example, of the order of $10^{19}$-$10^{22}$ atoms/$cm^3$). The extrinsic base region Rbe is separated from the emitter region Re by a corresponding portion of the intrinsic base region Rbi (for example, with a minimum guard distance between them on the front surface 105 of the order of 1-10 μm, and preferably 3-7 μm (such as 5 μm). For example, this result is achieved by a ion implantation operation, followed by an annealing operation, and a diffusion operation; during the above-described thermal operations, the intermediate insulating layer 115 re-grows, so as to cover again the extrinsic base region Rbe (with a profile of the intermediate insulating layer 115 that may be deemed substantially planar because of its low thickness).

Figure 1I:
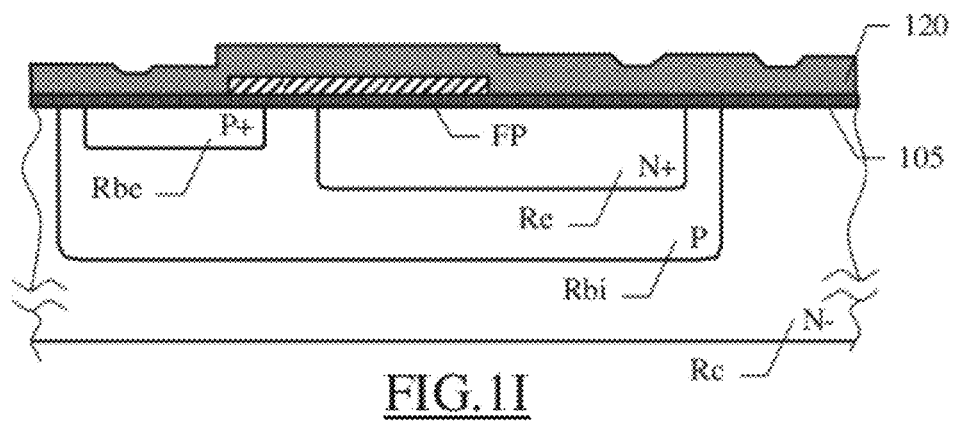

Moving to FIG. 1I, a layer of poly-silicon material is deposited on the intermediate insulating layer 115, and it is then patterned so as to obtain a field plate FP. The field plate FP bridges between the extrinsic base region Rbe and the emitter region Re. For example, this result is achieved by means of a lithographic operation based on a corresponding field plate mask (not shown in the figure); the field plate mask is aligned with the intrinsic base mask by means of a collimation operation with a corresponding reference mark that was formed during the corresponding photo-lithographic operation (so as to obtain the desired alignment of the field plate FP with the intrinsic base region Rbi, and then with the emitter region Re as well). For this purpose, it is possible to use process steps that are already available in the MOS technology to form its poly-silicon gates. A further insulating layer 120 (for example, an inter-level insulating layer of silicon dioxide) is then formed on the intermediate insulating layer 115 and the field plate FP; this result may be achieved, for example, by a thermal process.

Figure 1J:
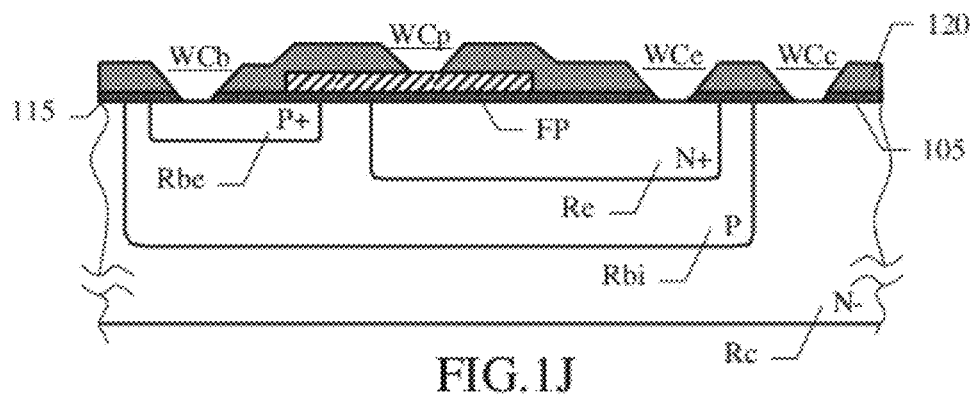

The production process continues to FIG. 1J, wherein four contact windows are formed; particularly, a collector contact window WCc (in the case of a horizontal structure of the bipolar transistor), a base contact window WCb, and an emitter contact window WCe are opened through the inter-level insulating layer 120 and the (underlying) intermediate insulating layer 115 to expose a portion of the collector region Rc, the extrinsic base region Rbe, and the emitter region Re, respectively, and a field plate contact window WCp is opened through the inter-level insulating layer 120 so as to expose a portion of the field plate FP. For example, this result is achieved by means of a lithographic operation based on a corresponding contact mask (not shown in the figure). The contact mask is primarily aligned with the intrinsic base mask by means of a collimation operation with a corresponding reference mark that was formed during the corresponding photo-lithographic operation (so as to obtain the desired alignment of the contact windows WCc, WCb, WCe, WCp with the intrinsic base region Rbi, and then with the collector region Rc, the emitter region Rc, and the field plate FP as well); the contact mask is also secondarily aligned with the extrinsic base mask and the field plate mask by means of a collimation operation with corresponding reference marks that were formed during the corresponding photo-lithographic operations (to compensate possible errors caused by a degradation of the reference mark of the intrinsic base mask due to the process operations following its formation).

Figure 1K:
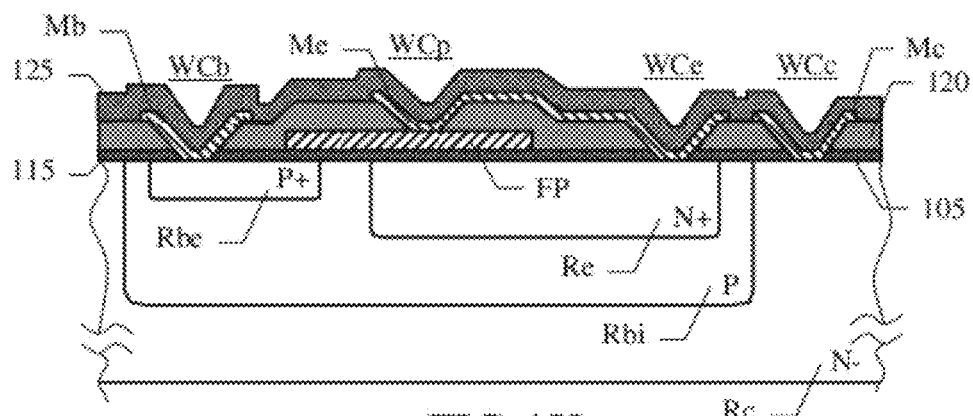

With reference to FIG. 1K, a metal layer is deposited on this structure, and it is then patterned so as to obtain a collector tap Mc in the case of the horizontal structure (contacting the collector region Rc through the collector contact window WCc), a base tap Mb (contacting the extrinsic base region Rbe through the base contact window WCb), and an emitter tap Me (contacting both the emitter region Re and the field plate FP through the emitter contact window WCe and the field plate contact window WCp, respectively). For example, this result is achieved by means of a lithographic operation based on a corresponding metal mask (not shown in the figure). The metal mask is aligned with the contact mask by means of a collimation operation with a corresponding reference mark that was formed during the corresponding photo-lithographic operation (so as to obtain the desired alignment of the taps Mc, Mb and Me with the contact windows WCc, WCb and WCe-WCp, respectively). A passivation insulating layer 125 (for example, a silicon dioxide layer) is then formed on the inter-level insulating layer 120 and the taps Mc,Mb, Me; this result may be achieved, for example, by a thermal process.

Figure 1L:
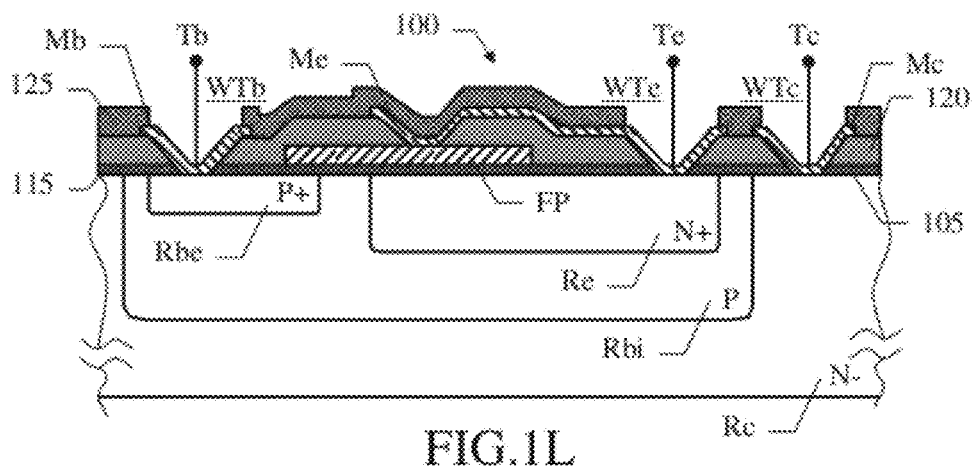

Moving to FIG. 1L, a collector terminal window WTc (in the case of the horizontal structure), a base terminal window WTb, and an emitter terminal window WTe are opened through the passivation insulating layer 125; particularly, the collector terminal window WTc exposes a portion of the collector tap Mc defining a collector terminal Tc, the base terminal window WTb exposes a portion of the base tap Mb defining a base terminal Tb, and the emitter terminal window WTe exposes a portion of the emitter tap Me defining an emitter terminal Te. For example, this result is achieved by means of a lithographic operation based on a corresponding passivation mask (not shown in the figure). The passivation mask is primarily aligned with the contact mask by means of a collimation operation with a corresponding reference mark that was formed during the corresponding photo-lithographic operation (so as to obtain the desired alignment of the terminal windows WTc,WTb,Wte with the corresponding contact windows WCc,WCb,WCe); the passivation mask is also secondarily aligned with the metal mask by means of a collimation operation with a corresponding reference mark that was formed during the corresponding photo-lithographic operations (to compensate possible errors caused by a degradation of the reference mark of the contact mask due to the metal layer). In this way, the desired bipolar injunction transistor 100 is obtained.

In a solution according to an embodiment, the total removal of the (thick) sacrificial insulating layer, and its replacement with the (thin) intermediate insulating layer 115 minimizes the volume that is available for trapping the free holes that may be due to ionizing radiations, thereby reducing their accumulation.

Moreover, the guard distance (between the extrinsic base region Rbe and the emitter region Re) avoids (or at least substantially limits) any base-to-emitter leakage current (which would instead be caused by an undesired Zener diode that would form if the extrinsic base region Rbe was in contact with the emitter region Re).

In this way, it is possible to limit the superficial inversion of the base region Rbi,Rbe (due to the trapped free holes in the intermediate insulating layer 115), without adversely affecting the base-emitter breakdown voltage of the bipolar transistor.

In the above-described technique, the photolithographic operation that is used to open the extrinsic base window is performed on a structure defined by the intermediate insulating layer 115, which is thin and planar; as a result, this photolithographic operation may be very accurate. This allows controlling the guard distance (between the extrinsic base region Rbe and the emitter region Re) with a high precision.

As a result, it is possible to obtain a radiation hardened bipolar transistor, which is highly insensitive to ionizing radiations (for example, capable of supporting a Total Radiation Dose (TID) up to several hundreds of kGy), and at the same time provides good electrical characteristics.

The further enabling feature of the field plate (bridging between the extrinsic base region Rbe and the emitter region Re, and being electrically connected to the emitter region Re through the emitter tap Me) facilitates the drifting and the recombination of the free holes due to ionizing radiations that may be formed in the intermediate insulating layer 115, so as to limit their accumulation. This further increases the radiation hardening characteristics of the bipolar transistor 100.

Figure 2:
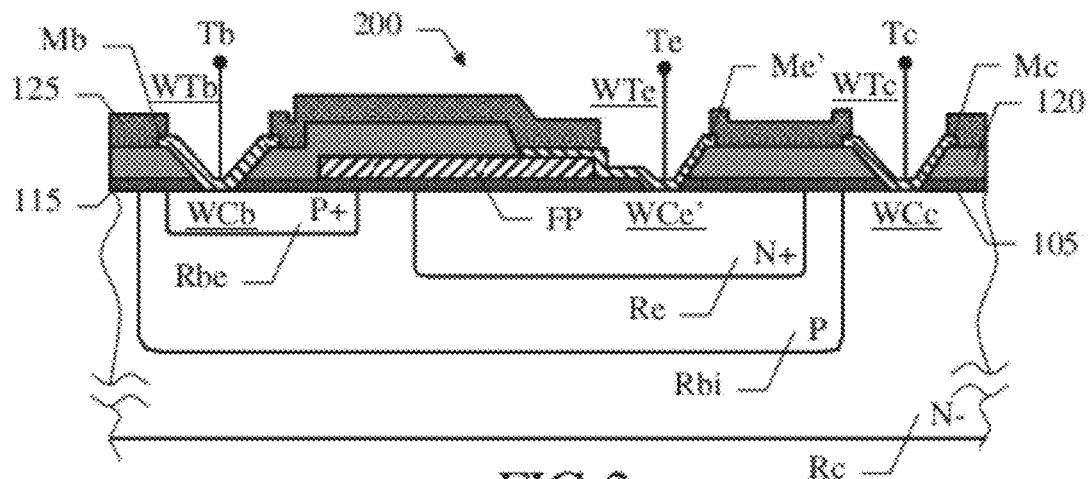
FIG. 2 shows a cross-section view of a bipolar transistor according to a further embodiment.

With reference to FIG. 2, there is shown a cross-section view of a bipolar injection transistor 200 according to a further embodiment. In this case, in the inter-level insulating layer 120 and the intermediate insulating layer 115 there is opened (in addition to the collector contact window WCc and the base contact window WCb) an emitter contact window WCe' that exposes both a portion of the emitter region Re and a portion of the field plate FP, and possibly a portion of the intermediate insulating layer 115 therebetween (without any distinct field plate contact window). The metal layer is now patterned so as to obtain (in addition to the collector tap Mc and the base tap Mb) an emitter tap Me' that contacts both the emitter region Re and the field plate FP through the emitter contact window WCe' (with the same emitter terminal window WTe that is then opened in the passivation insulating layer 125 to expose a corresponding portion of the emitter tap Me' defining the same emitter terminal Te).

The above-described structure allows obtaining the desired electrical connection between the field plate FP and the emitter region Re by opening a single contact window through the inter-level insulating layer 120 (i.e., the emitter contact window WCe').

Figure 3:
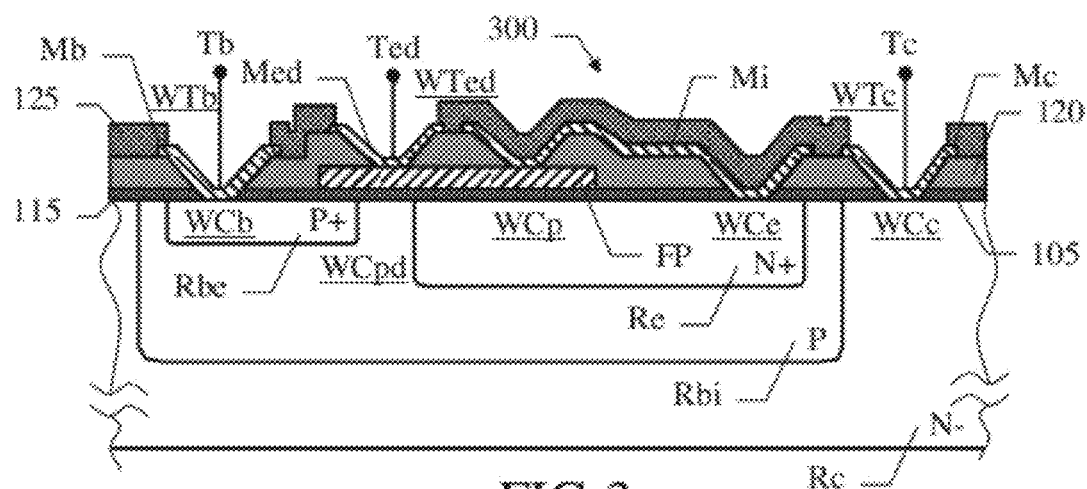
FIG. 3 shows a cross-section view of a bipolar transistor according to a further embodiment.

Moving to FIG. 3, there is shown a cross-section view of a bipolar injection transistor 300 according to a further embodiment. In this case, in the inter-level insulating layer 120 there is opened (in addition to the field plate contact window WCp that exposes a first portion of the field plate FP proximal to the emitter region Re, hereinafter referred to as first, or proximal, field plate contact window WCp) a second, or distal, field plate contact window WCpd that exposes a second portion of the field plate FP distal from the emitter region Re. The metal layer is now patterned so as to obtain (in addition to the collector tap Mc and the base tap Mb) a (distal) emitter tap Med and a distinct interconnection plate Mi; the emitter tap Med now contacts the field plate FP through the distal field plate contact window WCpd, whereas the interconnection tap Mi contacts both the emitter region Re and the field plate FP through the emitter contact window WCe and the proximal field plate contact window WCp, respectively. In the passivation insulating layer 125, there are now opened (in addition to the collector terminal window WTc and the base terminal window WTb) a (distal) emitter terminal window WTed that exposes a corresponding portion of the emitter tap Med defining a (distal) emitter terminal Ted (whereas the interconnection plate Mi remains completely covered by the passivation insulating layer 120).

Therefore, the emitter terminal Ted now contacts the emitter region Re through the field plate FP and the interconnection plate Mi. In this way, an emitter resistance of the bipolar transistor 200 is increased (by the resistance of the field plate FP and the interconnection plate Mi), so as to compensate the reduction of a base resistance thereof caused by the addition of the (highly doped) extrinsic base region Rbe. This allows providing both good radiation hardening characteristics and good thermal stability in the bipolar transistor 300.

Figure 4:
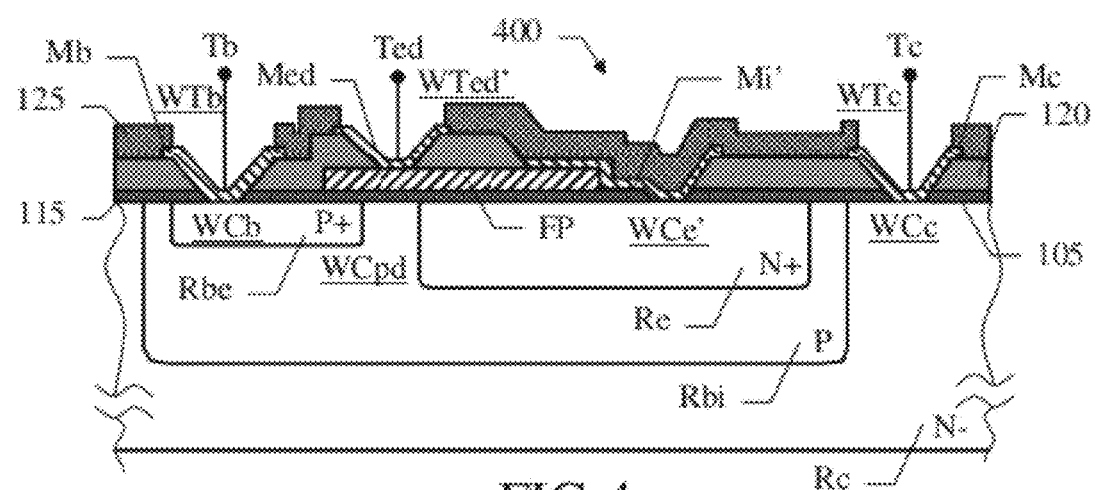
FIG. 4 shows a cross-section view of a bipolar transistor according to a further embodiment.

At the end, in FIG. 4 there is shown a cross-section view of a bipolar injection transistor 400 according to a further embodiment of the invention. As above, the collector contact window WCc, the base contact window WCb, and the emitter contact window WCe' (exposing both a portion of the emitter region Re and a first portion of the field plate FP, and possibly a portion of the intermediate insulating layer 115 therebetween) are opened in the inter-level insulating layer 120 and the intermediate insulating layer 115; moreover, the distal field plate contact window WCpd (exposing a second portion of the field plate FP distal from the emitter region Re) is opened in the inter-level insulating layer 120. The metal layer is again patterned so as to obtain the collector tap Mc, the base tap Mb, the emitter tap Med (contacting the field plate FP through the distal field plate contact window WCpd), and an interconnection plate Mi' (contacting both the emitter region Re and the field plate FP through the emitter contact window WCe'). In the passivation insulating layer 125, there are now opened the collector terminal window WTc, the base terminal window WTb, and the emitter terminal window WTed (exposing the corresponding portion of the emitter tap Med defining the emitter terminal Ted)—whereas the interconnection plate Mi' remains completely covered by the passivation insulating layer 120.

Therefore, as above the emitter terminal Ted contacts the emitter region Re through the field plate FP and the interconnection plate Mi'. In this way, it is possible to increase the emitter resistance of the bipolar transistor 400 (so as to compensate the reduction of the base resistance thereof caused by the addition of the extrinsic base region Rbe), and at the same time obtaining the desired electrical connection between the field plate FP and the emitter region Re by opening a single contact window through the inter-level insulating layer 120 (i.e., the emitter contact window WCe').

Figure 5:
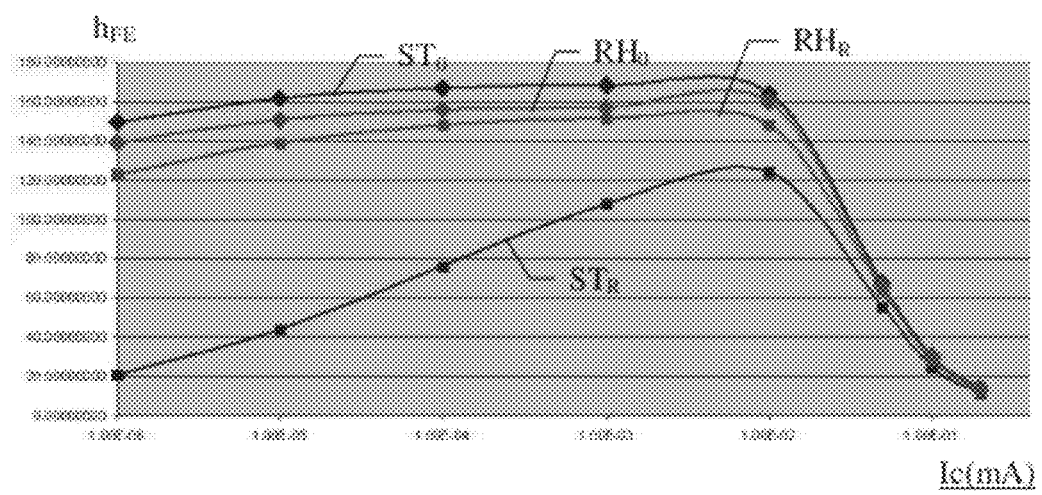
FIG. 5 shows a qualitative comparison among different bipolar transistors.

A qualitative comparison among different bipolar transistors is shown in FIG. 5. Particularly, the figure shows a diagram that plots the DC forward current gain $h_{FE}$ on the ordinate axis against the collector current (Ic, in mA) on the abscissa axis; for each bipolar transistor the diagram includes an $h_{FE}$-Ic characteristic curve (which shows the variation of the DC forward current gain h with the collector current Ic). More specifically, a characteristic curve $ST_0$ relates to a standard bipolar transistor without any irradiation (to be used as a reference). A characteristic curve $ST_R$ then relates to the same standard bipolar transistor after irradiation with TID=98. 0 kRad. A characteristic curve $RH_0$ instead relates to a rad-hard bipolar transistor according to an embodiment of the invention without any irradiation; a characteristic curve $RH_R$ then relates to the same rad-hard bipolar transistor after irradiation with TID=306. 0 kRad.

As can be seen, the characteristic curve $ST_R$ of the standard bipolar transistor (with irradiation) changes significantly with respect to its characteristic curve $ST_0$ (without any irradiation). Conversely, the characteristic curves $RH_0$ and $RH_R$ of the rad-hard bipolar transistor (without irradiation and with irradiation, respectively) are substantially the same. Therefore, the DC forward current gain $h_1$ of the rad-hard bipolar transistor does not exhibit any significant variation, even in the presence of a very high ionizing radiation. This makes the above-described technique well suited for special applications (such as avionic and aero-spatial applications) having very strict radiation hardening requirements.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible (for example, with respect to numerical values and materials). Particularly, different embodiments may even be practiced without the specific details set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

Moreover, the regions of the N-type may be replaced by regions of the P-type, and vice-versa; likewise, the various regions may have different concentrations of impurities, and the insulating layers may be made of different dielectric materials. The components of the bipolar transistor may also be obtained with other operations, or with different technologies; in addition, it is possible to use masks that are different in number and type, and with different alignment sequences. Particularly, the intermediate insulating layer may be of any other type (for example, a capacitor insulator).

The above-mentioned relationship between the thickness of the intermediate insulating layer and the sacrificial insulating layer is not to be interpreted in a limitative manner.

The field plate may be made of any other conductive material (for example, metal), and it may have any other shape and/or size; in any case, this feature is not strictly necessary, and it may be omitted in a simplified implementation of the proposed bipolar The electrical connection between the field plate and the emitter region may be obtained with any other structure (for example, by arranging each field plate contact window in any other position); in any case, nothing prevents forming the field plate simply as an extension of the emitter terminal.

Similar considerations apply if the bipolar transistor has a different structure or includes equivalent components, or it has other operative characteristics. In any case, every component thereof may be separated into more elements, or two or more components may be combined together into a single element; moreover, each component may be replicated to support the execution of the corresponding operations in parallel. It is also pointed out that (unless specified otherwise) any interaction between different components generally does not need to be continuous, and it may be either direct or indirect through one or more intermediaries.

For example, the collector terminal may be formed on a rear surface of the chip (in the case of a vertical structure), and the bipolar transistor may include highly doped emitter and collector contact regions; in any case, the same technique may also be applied to a bipolar transistor of the PNP type, or with another layout and/or structure (for example, of the lateral type). In any case, the bipolar transistor (even not of the small signal type) may be used in whatever other applications.

It should be readily apparent that the proposed bipolar transistor may be part of the design of an integrated circuit. The design may also be created in a hardware description language; moreover, if the designer does not manufacture chips or masks, the design may be transmitted by physical means to others. In any case, the resulting integrated circuit may be distributed by its supplier in raw wafer form, as a bare die, or in packages.

Moreover, the proposed bipolar transistor may be integrated with other circuits in the same chip; the chip may also be coupled with one or more other chips (such as a processor or a memory), or it may be mounted in intermediate products (such as mother boards). In any case, the integrated circuit is suitable to be used in complex systems (such as mobile telephones).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for integrating a bipolar transistor in a semiconductor chip having a main surface covered by a sacrificial insulating layer, the chip including a collector region of a first type of conductivity extending from a main surface of the chip, the method comprising steps of:
   forming an intrinsic base region of a second type of conductivity, the intrinsic base region extending in the collector region from the main surface under an intrinsic base window of the sacrificial insulating layer,
   forming an emitter region of the first type of conductivity, the emitter region extending in the intrinsic base region from the main surface under an emitter window of the sacrificial insulating layer,
   removing the sacrificial insulating layer, forming an intermediate insulating layer on the main surface, the intermediate insulating layer having a thickness lower than a thickness of the sacrificial layer, and forming an extrinsic base region of the second type of conductivity, the extrinsic base region extending in the intrinsic base region from the main surface under an extrinsic base window of the intermediate insulating layer, the extrinsic base region having a concentration of impurities higher than a concentration of impurities of the intrinsic base region and being separated from the emitter region by a portion of the intrinsic base region.

2. The method according to claim 1, wherein the thickness of the intermediate insulating layer is between 1/10 and 1/100 of the thickness of the sacrificial layer.

3. The method according to claim 1, further including steps of:

forming a field plate of conductive material on the intermediate insulating layer, the field plate bridging between the extrinsic base region and the emitter region, and electrically connecting the field plate to the emitter region.

4. The method according to claim 3, wherein the step of electrically connecting the field plate to the emitter region includes:

forming an emitter terminal contacting both the emitter region and the field plate.

5. The method according to claim 4, wherein:

the step of electrically connecting the field plate to the emitter region further includes:

covering the intermediate insulating layer and the field plate with a further insulating layer, and opening an emitter contact window through the further insulating layer and the intermediate insulating layer to expose a portion of the emitter region, and opening a field plate contact window through the further insulating layer to expose a portion of the field plate, and forming the emitter terminal contacting both the emitter region and the field plate comprises:

forming the emitter terminal to contact the emitter region through the emitter contact window, and forming the emitter terminal to contact the field plate through the field plate contact window.

6. The method according to claim 4, wherein:

the step of electrically connecting the field plate to the emitter region further includes:

covering the intermediate insulating layer and the field plate with a further insulating layer, and opening an emitter contact window through the further insulating layer and the intermediate insulating layer to expose both a portion of the emitter region and a portion of the field plate, and forming the emitter terminal contacting both the emitter region and the field plate comprises forming the emitter terminal to contact both the emitter region and the field plate through the emitter contact window.

7. The method according to claim 3, wherein the step of electrically connecting the field plate to the emitter region includes:

forming an interconnection plate connecting the field plate to the emitter region, and forming an emitter terminal contacting the field plate.

8. The method according to claim 7, wherein:

forming the interconnection plate connecting the field plate to the emitter region comprises:

covering the intermediate insulating layer and the field plate with a further insulating layer, opening an emitter contact window through the further insulating layer and the intermediate insulating layer to expose a portion of the emitter region, opening a first field plate contact window and a second field plate contact window through the further insulating layer to expose a first portion and a second portion, respectively, of the field plate, and forming the interconnection plate to contact the emitter region and the field plate through the emitter contact window and the first field plate contact window, and forming the emitter terminal contacting the field plate comprises forming the emitter terminal to contact the field plate through the second field plate contact window.

9. The method according to claim 7, wherein:

the step of electrically connecting the field plate to the emitter region includes:

covering the intermediate insulating layer and the field plate with a further insulating layer, opening an emitter contact window through the further insulating layer and the intermediate insulating layer to expose both a portion of the emitter region and a first portion of the field plate, and opening a field plate contact window through the further insulating layer to expose a second portion of the field plate, and forming the interconnection plate connecting the field plate to the emitter region comprises:

forming the interconnection plate to contact both the emitter region and the field plate through the emitter contact window, and forming the emitter terminal to contact the field plate through the field plate contact window.

10. A method comprising:

forming an intrinsic base region of a bipolar transistor in a semiconductor chip, at least a portion of the intrinsic base region being formed in a collector region of the semiconductor chip under a window in a first insulating layer of the semiconductor chip;

removing the first insulating layer from the semiconductor chip;

forming a second insulating layer on the semiconductor chip, the second insulating layer having a thickness less than a thickness of the first insulating layer, and forming an extrinsic base region of the bipolar transistor in the semiconductor chip, at least a portion of the extrinsic base region being formed in the intrinsic base region under a window in the second insulating layer;

wherein the window in the first insulating layer is a first window in the first insulating layer, and wherein the method further comprises forming an emitter region of the bipolar transistor in the semiconductor chip, at least a portion of the emitter region being formed in the intrinsic base region under a second window in the first insulating layer.

11. The method of claim 10, wherein:

forming the intrinsic base region comprises doping the intrinsic base region to have a first concentration of impurities, and forming the extrinsic base region comprises doping the extrinsic region to have a second concentration of impurities higher than the first concentration of impurities.

12. The method of claim 10, wherein the extrinsic base region is separated from an emitter region of the bipolar transistor by at least a portion of the intrinsic base region.

13. The method of claim 12, wherein the portion of the intrinsic base region separating the extrinsic base region from the emitter region has a width between 1 μm and 10 μm between the extrinsic base region and the emitter region.

14. The method of claim 10, wherein the first insulating layer comprises a silicon dioxide layer.

15. The method of claim 10, further comprising forming the first insulating layer by thermal oxidation.

16. The method of claim 10, wherein a thickness of the first insulating layer is on the order of 0.5 μm to 2 μm.

17. The method of claim 10, wherein the second insulating layer comprises a silicon dioxide layer.

18. The method of claim 10, wherein a thickness of the second insulating layer is between 0.5% and 20% of a thickness of the first insulating layer.

19. The method of claim 10, wherein a thickness of the second insulating layer is between 50 nm and 200 nm.

20. The method of claim 10, wherein the second insulating layer is radiation hardened.

21. The method of claim 10, wherein the second insulating layer is planar.

22. The method of claim 10, further including:
   forming a field plate of conductive material on the second insulating layer, the field plate bridging between the extrinsic base region and the emitter region, and
   electrically connecting the field plate to the emitter region.

23. The method of claim 22, wherein electrically connecting the field plate to the emitter region includes:
   forming an interconnection plate connecting the field plate to the emitter region, and
   forming an emitter terminal contacting the field plate.

24. The method according to claim 23, wherein:
   forming the interconnection plate connecting the field plate to the emitter region comprises:
      covering the second insulating layer and the field plate with a third insulating layer,
      opening a window through the second and third insulating layers to expose a portion of the emitter region and a first portion of the field plate,
      opening a field plate contact window through the third insulating layer to expose a second portion of the field plate, and
      forming the interconnection plate to contact both the emitter region and the field plate through the emitter contact window; and
   forming the emitter terminal contacting the field plate comprises forming the emitter terminal to contact the field plate through the field plate contact window.

* * * * *